(12) United States Patent
Zhu

(10) Patent No.: US 7,919,387 B2
(45) Date of Patent: Apr. 5, 2011

(54) STRUCTURE AND METHOD FOR MANUFACTURING MEMORY

(75) Inventor: Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 282 days.

(21) Appl. No.: 12/049,602

(22) Filed: Mar. 17, 2008

(65) Prior Publication Data

US 2009/0230455 A1   Sep. 17, 2009

(51) Int. Cl.
  *H01L 21/76* (2006.01)
(52) U.S. Cl. ...................................... 438/424
(58) Field of Classification Search .......... 438/142–308, 438/689–757, 800
  See application file for complete search history.

(56) References Cited

U.S. PATENT DOCUMENTS

| | | | |
|---|---|---|---|
| 5,966,597 A | 10/1999 | Wright | |
| 5,973,354 A | 10/1999 | Chang | |
| 6,236,094 B1 | 5/2001 | Wright | |
| 6,875,660 B2 | 4/2005 | Hung et al. | |
| 2004/0105319 A1* | 6/2004 | Jeng et al. | 365/199 |
| 2005/0224860 A1* | 10/2005 | Hendriks et al. | 257/315 |
| 2006/0194390 A1* | 8/2006 | Imai et al. | 438/257 |
| 2006/0226474 A1 | 10/2006 | Ho et al. | |
| 2006/0263978 A1* | 11/2006 | Wang et al. | 438/254 |
| 2007/0029600 A1 | 2/2007 | Cohen | |
| 2007/0122971 A1 | 5/2007 | Dobuzinsky et al. | |
| 2008/0213969 A1* | 9/2008 | Seo | 438/424 |

OTHER PUBLICATIONS

Quirk, Michael, et al. Semiconductor Manufacturing Technology. Upper Saddle River: Prentice-Hall, Inc. 2001. ISBN#0-13-081520-9. pp. 280-283.*

* cited by examiner

*Primary Examiner* — Michael S Lebentritt
*Assistant Examiner* — Karen M Kusumakar
(74) *Attorney, Agent, or Firm* — Scully, Scott, Murphy & Presser, P.C.

(57) ABSTRACT

The present invention provides a memory device including at least two of a first dielectric on a semiconductor substrate; a floating gates corresponding to each of the at least two gate oxides; a second dielectric on the floating gates; a control gate conductor formed atop the second gate oxide; source and drain regions present in portions of the semiconducting substrate that are adjacent to each portion of the semiconducting substrate that is underlying the at least two of the first gate oxide, wherein the source and drain regions define a length of a channel positioned therebetween; and a low-k dielectric material that is at least present between adjacent floating gates of the floating gates corresponding to each of the at least two gate oxides, wherein the low-k dielectric material is present along a direction perpendicular to the length of the channel positioned therebetween.

15 Claims, 5 Drawing Sheets

STRUCTURE AND METHOD FOR MANUFACTURING MEMORY

FIELD OF THE INVENTION

The present invention in one embodiment relates to memory devices and methods of fabricating the same.

BACKGROUND OF THE INVENTION

Flash memory is non-volatile, which means that it does not need power to maintain the information stored in the chip. Flash memory is a technology that is primarily used in memory cards, and USB flash drives (thumb drives, handy drive, memory stick, flash stick, jump drive) for general storage and transfer of data between computers and other digital products. Examples of applications include PDAs and laptop computers, digital audio players, digital cameras and mobile phones. It has also gained some popularity in the game console market. In addition, flash memory offers read access times and better kinetic shock resistance than hard disks.

Conventional flash memory products employ floating gate technologies, that is, gates that are completely surrounded by an insulating layer, such as silicon oxide. The presence or absence of charge in the floating gates represents binary information. With aggressive scaling of flash devices, disadvantages in the interaction of adjacent floating gates becomes apparent, which typically causes an undesirable threshold voltage ($V_t$) shift.

SUMMARY OF THE INVENTION

The present invention in one embodiment provides a memory device, and a method for forming a memory device. In one embodiment, the present invention reduces the interaction between the floating gate conductors of adjacent flash memory cells by inserting a low-k dielectric material between the adjacent flash memory cells. For example, the present invention reduces the interaction between the floating gates of adjacent flash memory cells by inserting the low-k material between the floating gate conductors of the adjacent memory cells.

In one embodiment, the present invention provides a memory device comprising:
at least two gate dielectrics of a first dielectric material on a semiconductor substrate;
floating gate conductors overlying each of the at least two gate dielectrics of the first delectric material;
a second dielectric material on the floating gate conductors;
a control gate conductor formed atop the second dielectric material;
a source region and a drain region present in portions of the semiconducting substrate that are adjacent to each portion of the semiconducting substrate that is underlying the at least two gate dielectrics of the first dielectric material, wherein the source region and the drain region define a length of a channel positioned therebetween; and
a low-k dielectric material that is at least present between adjacent floating gate conductors of the floating gates conductors corresponding to each of the at least two gate dielectrics, wherein the low-k dielectric material is present across a dimension separating the adjacent floating gate conductors that is in a direction perpendicular to the length of the channel.

In one embodiment, the memory device is a flash memory device. In one embodiment, the flash memory device is an NAND flash memory device.

In one embodiment, the low-k dielectric material comprises an oxide, such as silicon oxide. In one embodiment, the low-k dielectric material has a dielectric constant of less than about 3.5. In one embodiment, the low-k dielectric material is a carbon-doped oxide, an aromatic hydrocarbon polymer composition, a fluorine doped glass, a boron phosphorus silicate glass (BPSG), or a combination thereof. In one embodiment, the low-k dielectric material is gas such as air.

In one embodiment, the floating gate conductors are encapsulated by dielectric material. In one embodiment, the dielectric material that encapsulates the floating gate conductors comprise at least one spacer positioned along the sidewalls of the floating gate conductors, the first dielectric material, the second dielectric material, and the low-k dielectric material.

In one embodiment, the memory device further comprise at least one isolation region extending into the semiconducting substrate between the adjacent floating gate conductors corresponding to each of the at least two gate dielectrics.

In another aspect the present invention provides a method of forming a memory device. In one embodiment, the method produces the memory device described above. In one embodiment, the method comprises:
forming at least two floating gate structures on a semiconductor substrate;
forming a dielectric layer on the at least two floating gate structures;
forming a control gate conductor overlying each of the at least two floating gate structures, wherein the control gate conductor is separated from the each of the at least two floating gate structures by the dielectric layer;
forming a low-k dielectric material between adjacent floating gate conductors of the at least two floating gate structures, wherein the low-k dielectric material is present along a first direction separating the adjacent floating gate conductors; and
forming a source region and a drain region the semiconducting substrate that are adjacent to each portion of the semiconducting substrate that is underlying the at least two floating gate structures, wherein the first direction separating the adjacent floating gate conductors is perpendicular to the length of a channel positioned between the source and drain regions.

In one embodiment, the memory device produced by the above method is a flash memory device. In one embodiment, the flash memory device that is produced by the above method is an NAND flash memory device.

In one embodiment, the method further includes forming at least one isolation region in the semiconductor substrate between the adjacent floating gate structures.

In one embodiment, the method further includes forming at least one spacer abutting the floating gate structures after the formation of the dielectric layer, wherein the dielectric layer is present on a surface of the semiconductor substrate between the adjacent floating gate structures, a top surface of the floating gate structures, and a sidewall of the floating gate structures, wherein the dielectric layer is present between the spacers and the floating gate structures.

In one embodiment, the method further includes forming a sacrificial material atop the dielectric layer that is present between the adjacent floating gate structures, wherein the upper surface of the sacrificial material is substantially coplanar with the upper surface of the adjacent floating gate structures.

In one embodiment, the step of forming the low-k dielectric material between the adjacent floating gate structures of the at least two floating gate structures includes etching the sacrificial material to provide voids between the adjacent floating gate structures, depositing the low-k dielectric material within the voids, and etching the low-k dielectric material to have an upper surface substantially co-planar with the upper surface of the adjacent floating gate structures. In one embodiment, the sacrificial material comprises SiGe.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION OF THE INVENTION

Figure 1:
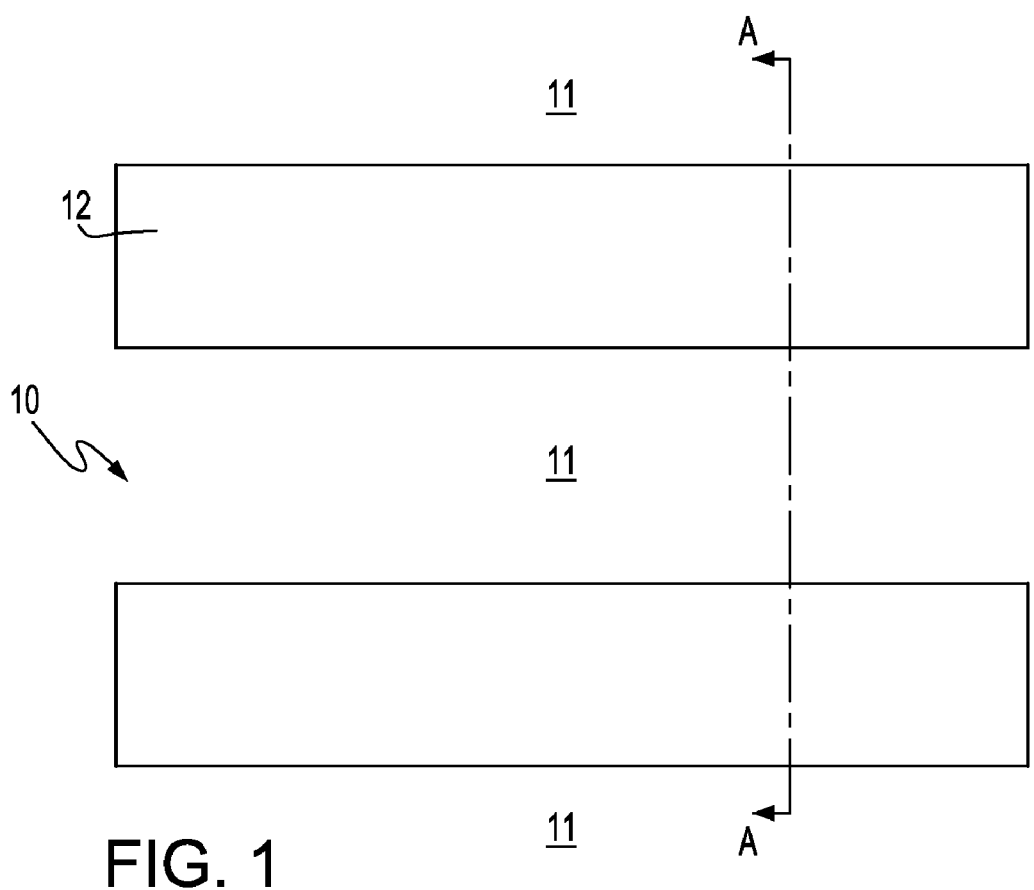
FIG. 1 is a top view of an initial structure including a semiconductor substrate, trench isolation regions, and a floating gate structure, in accordance with the present invention.

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The embodiments of the present invention relate to novel memory devices and methods of forming memory devices. When describing the methods and structures, the following terms have the following meanings, unless otherwise indicated.

As used herein, the term "memory device" means a structure in which the electrical state of which can be altered and then retained in the altered state; in this way a bit of information, i.e., "1" or "0", can be stored.

The term "flash memory device" is non-volatile memory that can be erased and reprogrammed.

As used herein, the term "floating gate" denotes the gate of a floating-gate MOSFET, wherein a dielectric surrounds the floating gate, substantially in its entirely, so charge is stored on the floating gate, wherein the charge stored on the floating gate can be modified by applying voltages to the source, drain, and control gate.

As used herein, the term "control gate" denotes the gate conductor overlying the floating gate, but seperated from the floating gate by a dielectric layer, in which the floating gate's only link to the row, or wordline, of a device is through the control gate, wherein switching from a stored value of "1" to a "0" requires the mechanism of Fowler-Nordheim tunneling.

A "floating gate structure" is a floating gate conductor and the corresponding gate dielectric.

As used herein, the terms "insulating" and "dielectric" denote a non-metallic material that has a room temperature conductivity is less than about $10^{-10}$ $(\Omega\text{-m})^{-1}$.

The term "low-k dielectric" denotes a dielectric material having a dielectric constant of 4.0 or less.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures.

FIGS. 1-9 depict one embodiment of a method for forming a memory device 100 that includes the steps of forming at least two floating gate structures 50 on a semiconductor substrate 10; forming a dielectric layer 15 on the at least two floating gate structures 50; forming a control gate conductor 20 overlying each of the at least two floating gate structures 50, wherein the control gate conductor 20 is separated from the each of the at least two floating gate structures 50 by the dielectric layer 15; forming a low-k dielectric material 40 between adjacent floating gate conductors 13a of the at least two floating gate structures 50, wherein the low-k dielectric material 40 is present along a first direction separating the adjacent floating gate conductors 13a; and forming source and drain regions 30 in the semiconducting substrate 10 that are adjacent to each portion of the semiconducting substrate 10 that is underlying the at least two floating gate structures 50, wherein the first direction separating the adjacent floating gate conductors 13a is perpendicular to the length L1 of a channel 35 positioned between the source and drain regions 30.

Figure 2:
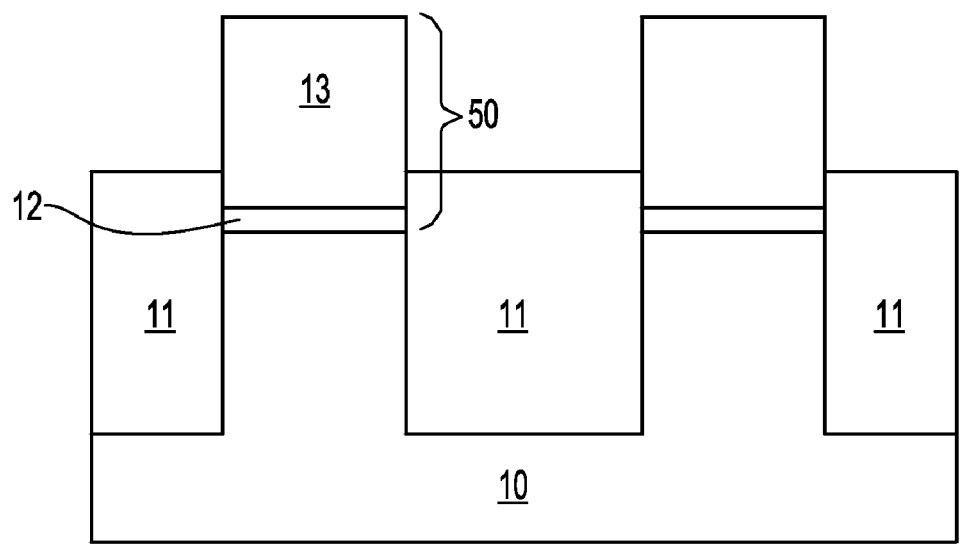
FIG. 2 is a side cross sectional view of the initial structure depicted in FIG. 1 along section line A-A, in accordance with one embodiment of the present invention.

FIGS. 1 and 2 depict one embodiment of an initial structure including a semiconductor substrate 10, isolation regions 11, and a floating gate structure 50, in accordance with the present invention.

The semiconductor substrate 10 shown in FIG. 1 comprises any conventional semiconductor material. In one embodiment, the semiconductor substrate 10 may comprise, for example, Si, SiC, SiGe, SiGeC, Ge alloys, GaAs, InAs, InP as well as other III/V or II/VI compounds semiconductors. In another embodiment, the semiconductor substrate 10 may also comprise a layered semiconductor such as, for example, a silicon-on-insulator or a SiGe-on-insulator. In yet a further embodiment, the semiconductor substrate 10 is a Si-containing semiconductor, such as Si, SiGe, SiC, SiGeC, a silicon-on-insulator or a SiGe-on-insulator.

In one embodiment, the semiconductor substrate 10 further includes at least one isolation region, such as shallow trench isolation regions. In one embodiment, the shallow trench isolation regions 11 are formed by etching a trench in the substrate 10 utilizing an etching process, such as reactive-ion etching (RIE) or plasma etching. In one embodiment, the trench may optionally be lined with a liner material, e.g., an oxide, and then CVD or another like deposition process is used to fill the trench with a dielectric, such as oxide, nitride or oxynitride. The STI dielectric may optionally be densified after deposition. In one embodiment, a planarization process such as chemical-mechanical polishing (CMP) may optionally be used to provide a planar structure.

The floating gate structures 50 include a floating gate conductor 13 and a first dielectric 12, i.e., first dielectric layer 12, which may be referred to as a gate dielectric of a first dielectric material 12. In one embodiment, the first dielectric 12 is formed atop the substrate 10 utilizing a thermal growth process, such as, for example, oxidation, nitridation and/or oxynitridation. In another embodiment, a deposition process such as CVD or PECVD can be used. The first dielectric 12 may be comprised of an oxide, nitride, oxynitride or multilayers thereof. In one embodiment, the first dielectric is silicon oxide. In one embodiment, the first dielectric 12 may have a thickness ranging from about 3 nm to about 15 nm.

In one embodiment, the floating gate conductor 13 comprises a metal, a metal alloy, a metal silicide, polysilicon that is doped, or a combination thereof, including multilayers. In one embodiment, the floating gate conductor 13 is formed utilizing a deposition process, such as CVD, plasma-assisted CVD, plating, sputtering and/or similar deposition processes followed by planarization. In one embodiment, when doped polysilicon is used as the floating gate conductor 13, an in-situ doping deposition process may be employed. In another embodiment, when a polysilicon floating gate conductor 13 is employed, the polysilicon gate conductor is formed by deposition, planarization, ion implantation and annealing. In one embodiment, the floating gate conductor 13 has a height ranging from about 10 nm to about 50 nm. In another embodiment, the floating gate conductor 13 has a height ranging from about 20 nm to about 40 nm.

In one embodiment, the floating gate structure 50 is produced by blanket deposition of material layers for the first dielectric 12, followed by the material for the floating gate conductor 13, to provide a material stack that is further processed to provide the floating gate structure 50 using conventional photolithography and etching. It is noted that the in some embodiments of the present invention, the isolation regions 11 may be formed in conjunction with the process steps that are utilized to provide the floating gate structure 50. For example, in one embodiment, the etch steps used to etch the material stack of the blanket dielectric layers for the floating gate conductor 13 and the first dielectric 12 may be continued to produce a trench in the substrate 10, which may be subsequently filled with a dielectric material in providing an isolation region 11. It is noted that in the embodiment of the present invention depicted in FIG. 2, the upper surface of the first dielectric 12 is recessed relative to the upper surface of the isolation region 11, wherein a portion of the isolation region 11 abuts a portion of the sidewall of the floating gate conductor 13.

Figure 3:
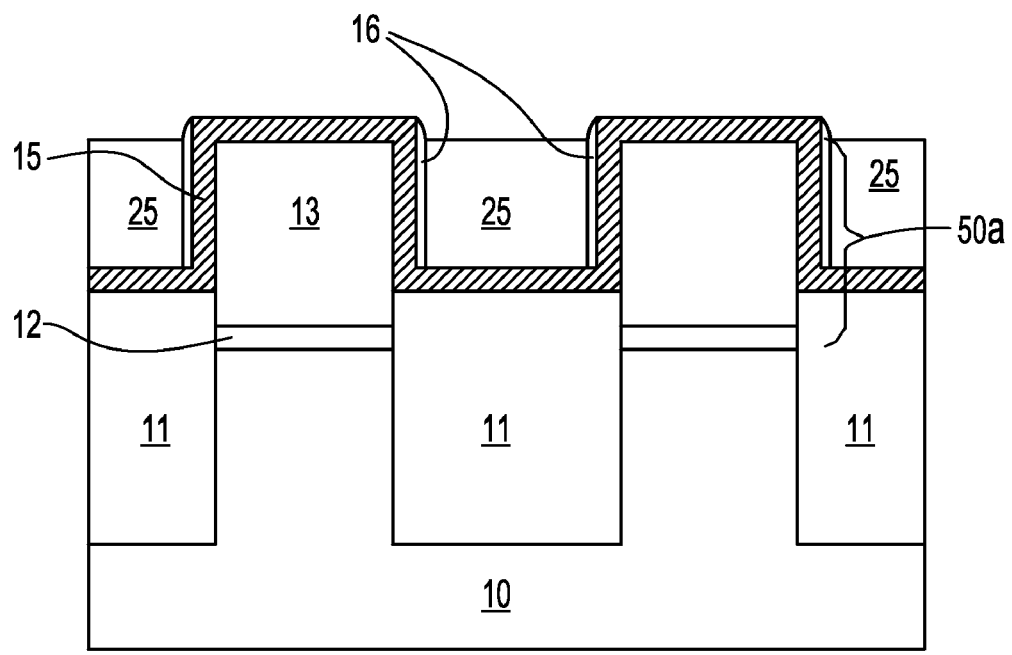
FIG. 3 is a side cross sectional view along section line A-A depicting depositing a dielectric layer atop the structure depicted in FIG. 2, forming spacers adjacent the floating gate, and forming a sacrificial material atop the dielectric layer that is present between the adjacent floating gate structures, in accordance with one embodiment of the present invention.

FIG. 3 depicts one embodiment of a process flow that includes depositing a second dielectric 15, i.e., second dielectric layer 15 or second dielectric material 15, atop the structure depicted in FIG. 2; forming at least one spacer 16 adjacent the floating gate conductor 13, and forming a sacrificial material 25 atop the second dielectric 15 that is present between the adjacent floating gate conductors 13a, in accordance with one embodiment of the present invention.

In one embodiment, the second dielectric 15 encapsulates the floating gate conductor 13. More specifically, in one embodiment the second dielectric 15 is present on the upper surface of the floating gate conductor 13, the sidewalls of the floating gate conductor 13 and extends to the portion of the substrate 10 that is present between the adjacent gate structures 50a.

In one embodiment, the second dielectric 15 is formed utilizing a deposition process, such as chemical vapor deposition (CVD), evaporation, spin-on coating, or chemical solution deposition. Chemical Vapor Deposition is a deposition process in which a deposited species is formed as a result of a chemical reaction between gaseous reactants at greater than room temperature (25° C. to 600° C.), wherein solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD) Plasma Enhanced CVD (EPCVD), Metal-Organic CVD (MOCVD) and combinations thereof may also be employed. In another embodiment, a thermal growth process can be used, such as, for example, oxidation, nitridation and/or oxynitridation. In one embodiment, the second dielectric 15 is deposited using a conformal deposition process to provide a conformal layer atop the structure depicted in FIG. 2. The term "conformal layer" denotes a layer having a thickness that does not deviate from greater than or less than 20% of an average value for the thickness of the layer. In one embodiment, the second dielectric 15 may be comprised of an oxide, nitride, oxynitride or multilayers thereof. In one embodiment, the second dielectric is silicon oxide. In one embodiment, the second dielectric 15 may have a thickness ranging from about 3 to about 15 nm.

In one embodiment, the at least one spacer 16 is adjacent the floating gate 13 and abuts at least a portion of the floating gate 13 sidewall. In one embodiment, the spacers 16 are comprised of a dielectric material. In one embodiment, the spacers 16 are composed of doped polysilicon. In another embodiment, the spacers 16 are formed of a metal including, but not limited to: TiN, TaN, WN or combinations thereof. In one embodiment, the spacers 16 are formed by depositing a polysilicon or metal layer and etching the polysilicon or metal layer using an anisotropic etch step, wherein following etch the remaining portion of the polysilicon or metal layer is only present abutting the sidewall of the floating gate structure 50, wherein the second dielectric 15 is present between the spacers 16 and the floating gate structures 50. In one embodiment, the spacers 16 connect to the control gate, which provides enhanced control of the floating gate due to the large capacitance between the control gate and the floating gate.

In one embodiment, following the formation of the spacers 16, the sacrificial material 25 is formed atop the second dielectric 15 that is present between the adjacent floating gate structures 50a, in accordance with one embodiment of the present invention. In one embodiment, the sacrificial material 25 includes a silicon containing material. In one example, the silicon containing material is SiGe. In one embodiment, the sacrificial material 25 is formed utilizing a deposition process, such as chemical vapor deposition (CVD), evaporation, spin-on coating, or chemical solution deposition. In one embodiment, following deposition the sacrificial material 25 is recessed to be substantially coplanar with the upper surface of the second dielectric 15 that is present on the upper surface of the floating gate conductor 13. In one embodiment, the sacrificial material 25 is recessed using an etch process. In one embodiment, the etch process for recessing the sacrificial material 25 includes an etch chemistry that removes the sacrificial material 25, e.g., SiGe, selective to the second dielectric 15, e.g., silicon oxide.

Figure 4:
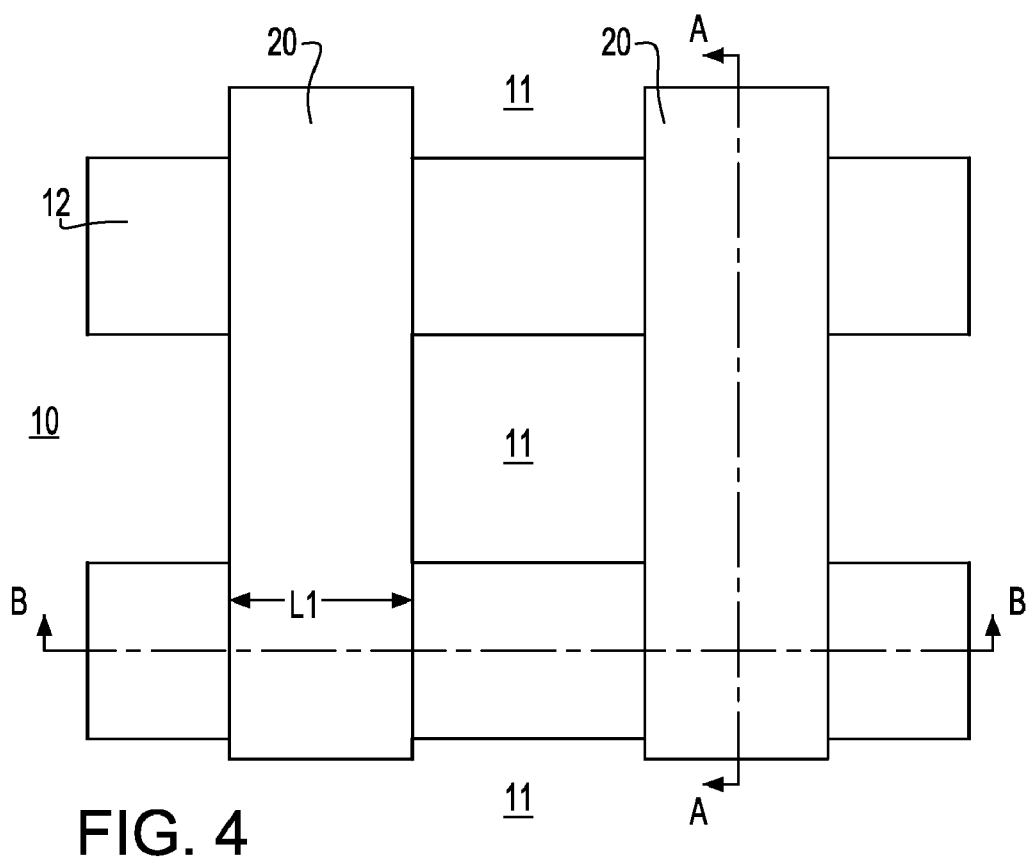
FIG. 4 is a top view depicting forming a control gate overlying each of the floating gate structures, in accordance with one embodiment of the present invention.
Figure 5:
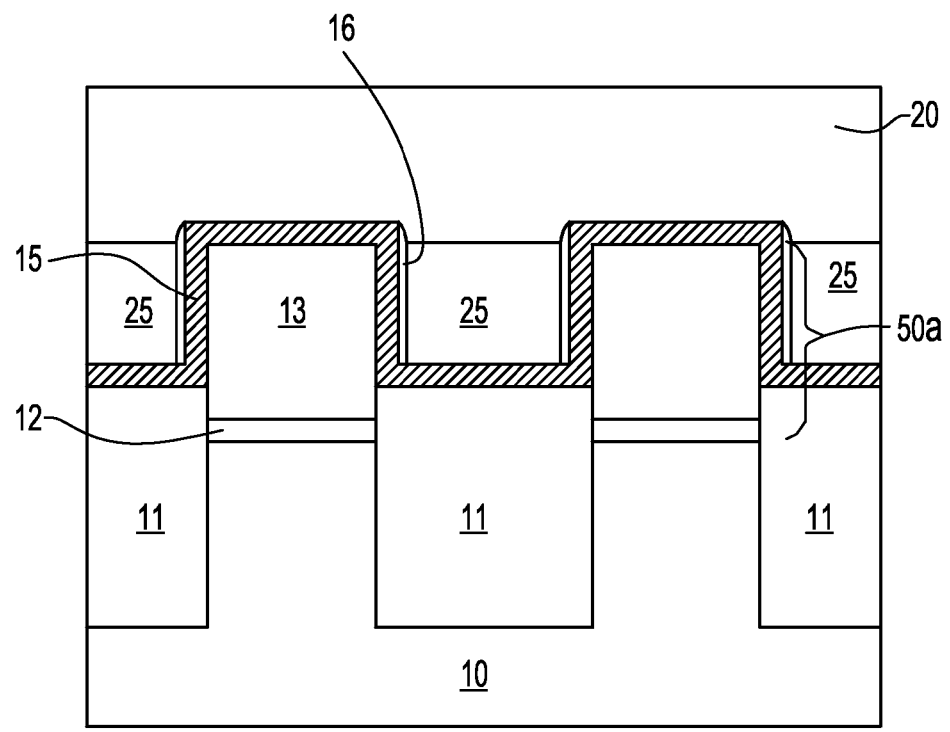
FIG. 5 is a side cross sectional view along section line A-A of the structure depicted in FIG. 4 that depicts forming a control gate overlying each of the floating gate structures, in accordance with one embodiment of the present invention.
Figure 6:
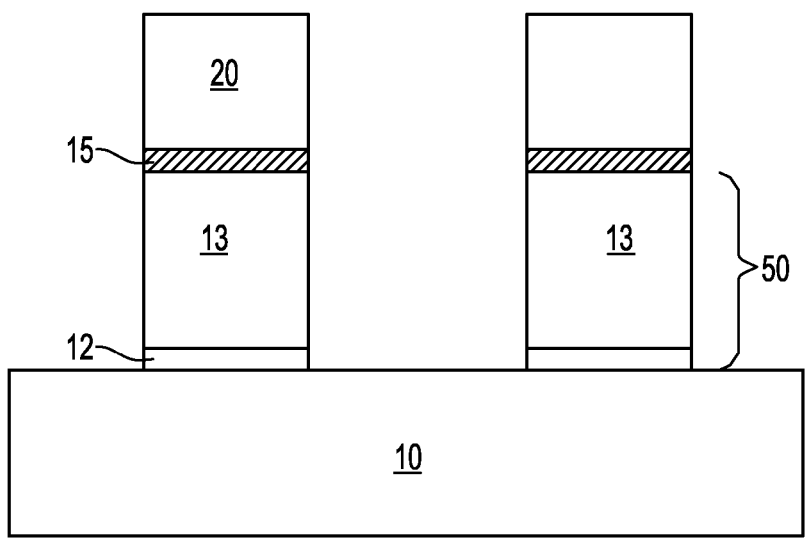
FIG. 6 is a side cross sectional view along section line B-B of the structure depicted in FIG. 4 that depicts forming a control gate overlying each of the floating gate structures, in accordance with one embodiment of the present invention.

Referring to FIGS. 4-6, in a following process sequence, a control gate conductor 20 is formed overlying each of the floating gate structures 50. In one embodiment, the control gate conductor 20 comprises a metal, a metal alloy, a metal silicide, polysilicon that is doped, or a combination thereof, including multilayers thereof. In one embodiment, the control gate conductor 20 is present on the second dielectric 15 that is positioned on the upper surface of the floating gate conductor 13.

In one embodiment, the control gate conductor 20 is formed utilizing a deposition process, such as CVD, plasma-assisted CVD, plating, sputtering and/or similar deposition processes. In one embodiment, when doped polysilicon is used as the control gate conductor 20, an in-situ doping deposition process may be employed. In another embodiment, when a polysilicon is employed for the control gate conductor 20, the polysilicon gate conductor is formed by deposition, planarization, ion implantation and annealing. In one embodiment, the control gate conductor 20 has a height ranging from about 20 nm to about 80 nm. In another embodiment, the control gate conductor 20 has a height ranging from about 30 nm to about 50 nm.

In one embodiment, the control gate conductor 20 is produced by blanket deposition of material for the control gate conductor 20 that is further processed using conventional photolithography and etching. Specifically, a pattern is produced by applying a photoresist to the surface to be etched; exposing the photoresist to a pattern of radiation; and then developing the pattern into the photoresist utilizing conventional resist developer. Once the patterning of the photoresist is completed, the sections covered by the photoresist are protected while the exposed regions are removed using a selective etching process that removes the unprotected regions.

In one embodiment, the control gate conductor 20 is patterned and etched to be positioned atop the floating gate structures 50 and extend along section line A-A, as depicted in FIG. 4. FIG. 5 is a side cross sectional view along section line A-A of the structure depicted in FIG. 4, in accordance with one embodiment of the present invention. FIG. 6 is a side cross sectional view along section line B-B of the structure depicted in FIG. 4, in accordance with one embodiment of the present invention.

Figure 7:
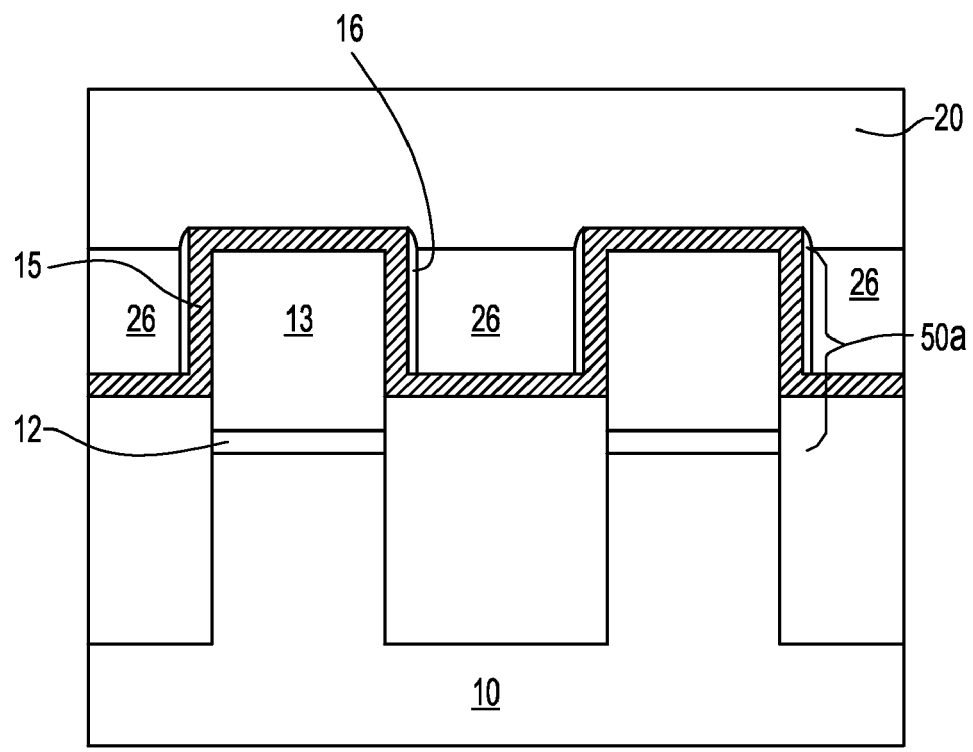
FIG. 7 is a side cross sectional view along section line A-A depicting etching the sacrificial material to provide voids between the adjacent floating gate structures, in accordance with one embodiment of the present invention.

FIG. 7 depicts one embodiment of removing the sacrificial material 25 to provide voids 26 between the adjacent floating gate conductors 13a. In one embodiment, the sacrificial material 25 is removed by a selective etch process. As used herein, the term selective in reference to a material removal process denotes that the rate of material removal for a first material is greater than the rate of removal for at least another material of the structure to which the material removal process is being applied. In one embodiment, the selective etch process removes the sacrificial material 25 selective to the material of the control gate conductor 20. In one embodiment, the sacrificial material 25 is removed by an etch process, such as reactive ion etch, plasma etching, or a combination thereof. Reactive ion etching (RIE) is a form of plasma etching in which the surface to be etched is placed on an RF powered electrode, wherein the surface to be etched takes on a potential that accelerates an etching species that is extracted from a plasma toward the surface to be etched, in which a chemical etching reaction is taking place in the direction normal to the surface.

Figure 8:
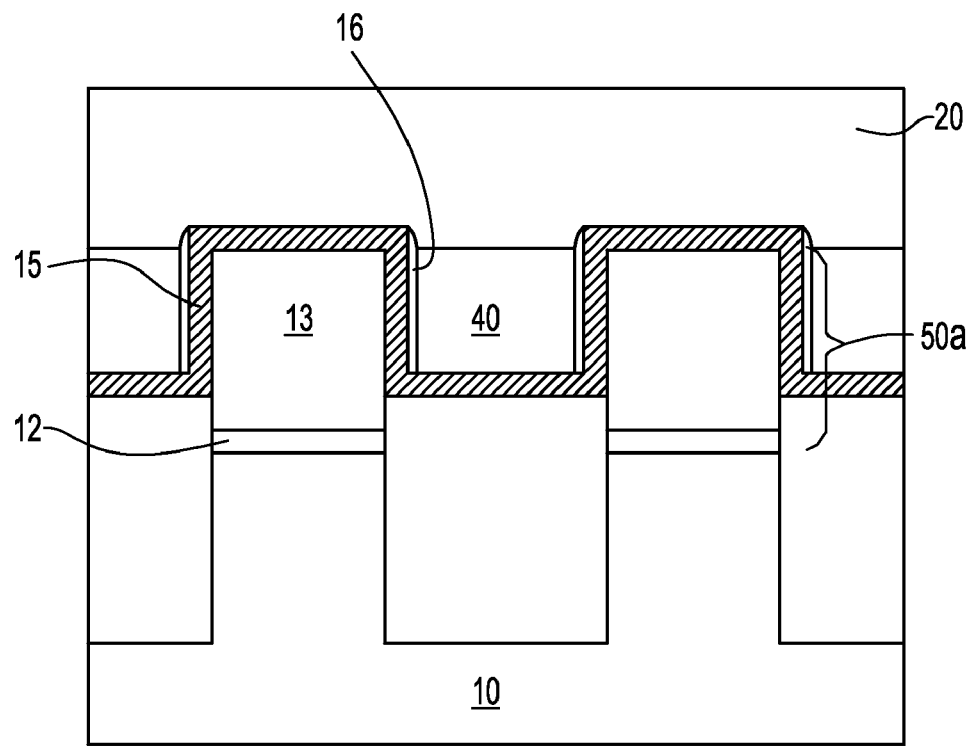
FIG. 8 is a side cross sectional view along section line A-A depicting forming a low-k dielectric material between adjacent floating gate structures, in accordance with one embodiment of the present invention.

FIG. 8 depicts forming a low-k dielectric material 40 between adjacent floating gate conductors 13a, in accordance with one embodiment of the present invention. In one embodiment, the low-k dielectric material 40 is composed of silicon oxide. In other embodiments of the present invention, the low-k dielectric material 40 may be provided by organic dielectrics, such as low dielectric constant polymer dielectrics, or may include low dielectric constant carbon-doped oxides. In one embodiment, the first low-k dielectric 40 may be composed of an aromatic hydrocarbon polymer composition. One example of a low-k dielectric polymer dielectric is SiLK™, supplied by DOW chemical company. Specifically, SiLK™ is a class of polymer-based low-k dielectric materials comprising a b-staged polymer having a composition including up to 95% carbon. An example of a low dielectric constant carbon doped oxide is SiCOH. In an even further embodiment, the low-k dielectric material 40 is provided by a fluorine-doped glass. In another embodiment, the void remains unfilled, wherein a provides the low-k dielectric.

In one embodiment, the low-k dielectric material 40 is formed utilizing a deposition process, such as chemical vapor deposition (CVD), evaporation, spin-on coating, or chemical solution deposition. Variations of CVD processes include, but are not limited to, Atmospheric Pressure CVD (APCVD), Low Pressure CVD (LPCVD) Plasma Enhanced CVD (EPCVD), Metal-Organic CVD (MOCVD) and combinations thereof may also be employed.

In one embodiment, following deposition, the low-k dielectric material 40 may be recessed to be substantially coplanar with the upper surface of the floating gate conductor 13. In one embodiment, the floating gate conductor 13 may be recessed using a selective etch process. In one embodiment, the low-k dielectric material 40 may be recessed by a selective etch process in which the etch chemistry removes the low-k dielectric material 40 selective to the material of the control gate conductor 20. In one embodiment, the low-k dielectric material 40 is removed by an etch process, such as reactive ion etch, plasma etching, ion beam etching, laser ablation or a combination thereof.

Figure 9:
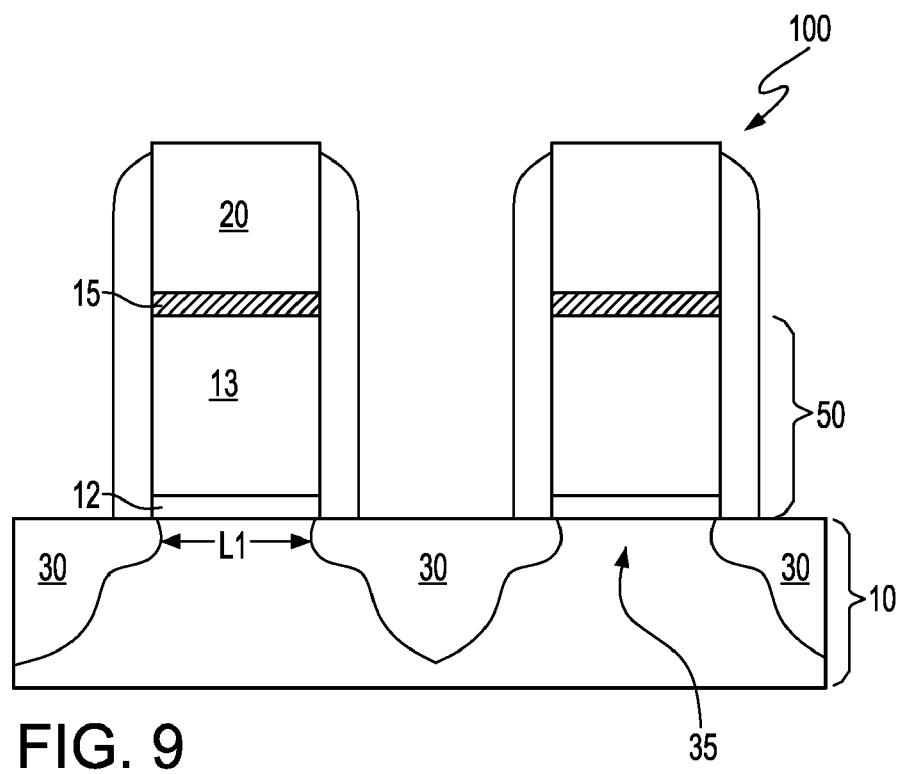
FIG. 9 is a side cross sectional view along section line B-B depicting forming the source and drain regions in the semiconducting substrate, in accordance with one embodiment of the present invention.

FIG. 9 is a side cross sectional side cross sectional view along section line B-B depicting forming the source and drain regions 30 in the semiconducting substrate 10. In one embodiment, the source and drain regions 30 may be doped with an n-type dopant atom (i.e., an element from Group VB of the Periodic Table of Elements, such as, for example, P, Sb or As) or a p-type dopant atom (such as an element from Group IIIB of the Periodic Table Elements, such as, for example, In, B or $BF_2$). In one embodiment, the implant energies used in forming the source and drain regions 30 typically range from about 10 keV to about 40 keV and ion doses ranging from about 1E15 to about 5E15 atoms/$cm^2$.

Optionally, a spacer such as a nitride spacer, may be employed during the implantation of the source and drain regions 30.

Referring to FIGS. 8 and 9, in one embodiment, the above-described method forms a memory device 100 that includes at least two gate dielectrics of a first dielectric material 12 on a semiconductor substrate 10; floating gate conductors 13 corresponding to each of the at least two gate dielectrics of a first dielectric material 12; a second dielectric material 15 on the floating gate conductors 13; a control gate conductor 20 formed atop the second dielectric material 15; source and drain regions 30 present in portions of the semiconducting substrate 10 that are adjacent to each portion of the semiconducting substrate 10 that is underlying the at least two gate dielectrics of the first dielectric material 12, wherein the source and drain regions 30 define a length L1 of a channel 35 positioned therebetween; and a low-k dielectric material 40 that is at least present between adjacent floating gates conductors 13a of the floating gate conductors corresponding to each of the at least two gate dielectrics of a first dielectric material 12, wherein the low-k dielectric material 40 is present across a dimension separating the adjacent floating gate conductors 13a that is in a direction perpendicular to the length L1 of the channel.

Figure 10:
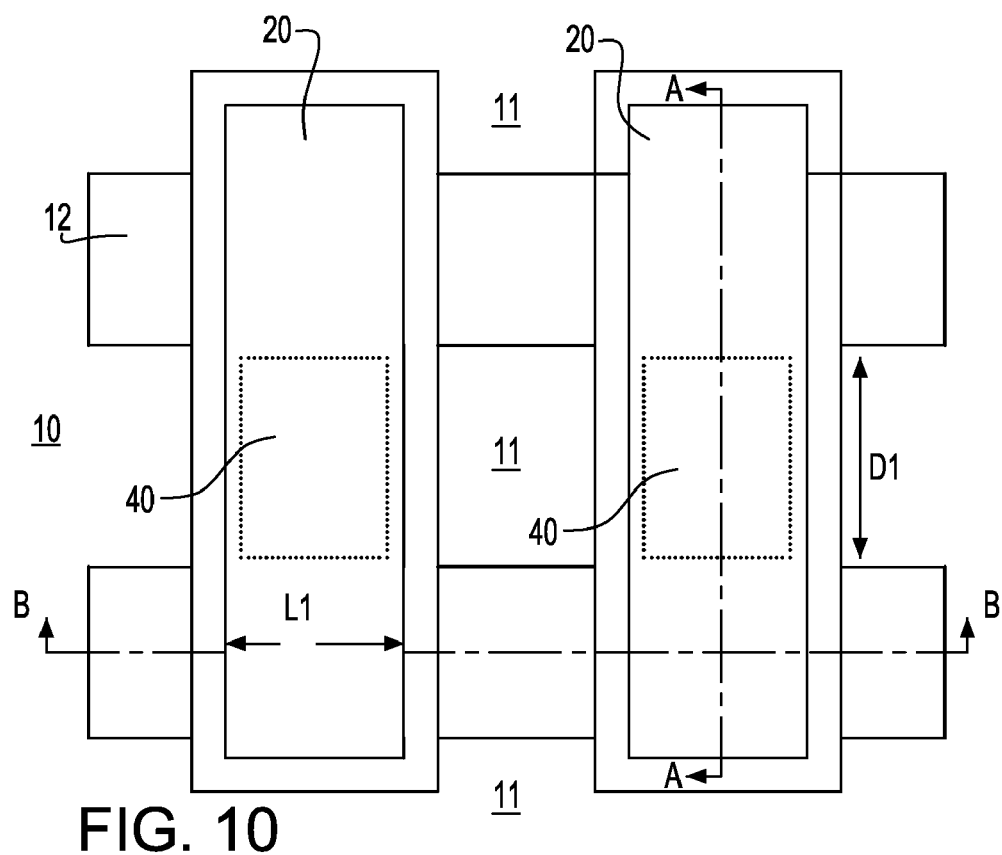
FIG. 10 is a top view depicting one embodiment of the resultant structure produced by the method of the present invention.

FIG. 10 is a top view depicting where the low-k dielectric material 40 is present across a dimension D1 separating the adjacent floating gate conductors 13a that is in a direction perpendicular to the length L1 of the channel.

In one embodiment, the memory device is a flash memory device. In one embodiment, the memory device is a NAND flash memory. NAND flash memory uses tunnel injection for writing and tunnel release for erasing.

In one embodiment, the present invention reduces the interaction of adjacent floating gate structures 50a that cause undesirable threshold voltage shifts. In one embodiment, the present invention reduces the interaction of adjacent floating gate structures 50a that cause undesirable threshold voltage shifts without reduces the height of the floating gates, and therefore reduces the interaction between adjacent floating gates without reducing the coupling ratio.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a memory device comprising:
    forming at least two floating gate structures on a semiconductor substrate;
    forming a conformal dielectric layer on the floating gate structures, wherein the conformal dielectric layer is present on an upper surface and sidewall surface of each of the at least two floating gate structures;
    forming a sacrificial material atop the conformal dielectric layer that is present between adjacent floating gate conductors of the floating gate structures;
    forming a control gate conductor overlying each of the at least two floating gate structures, wherein the control gate conductor is separated from the each of the at least two floating gate structures by the conformal dielectric layer;
    etching the sacrificial material to provide voids between the adjacent floating gate conductors;
    depositing a low-k dielectric material within the voids;
    etching the low-k dielectric material to have an upper surface substantially co-planar with the upper surface of the adjacent floating gate conductors, wherein the low-k dielectric material is present along a first direction separating the adjacent floating gate conductors; and
    forming a source region and the drain region in the semiconducting substrate that are adjacent to each portion of the semiconducting substrate that is underlying the at least two floating gate structures, wherein the first direction separating the adjacent floating gate conductors is perpendicular to the length of the channel.

2. The method of claim 1, wherein the low-k dielectric material comprises an oxide.

3. The method of claim 1, wherein the low-k dielectric material has a dielectric constant of less than about 3.5.

4. The method of claim 1, wherein the at least two floating gate structures include a floating gate atop a gate dielectric.

5. The method of claim 1 further comprising forming at least one isolation region in the semiconductor substrate between the adjacent floating gate conductors.

6. The method of claim 1, further comprising forming at least one spacer abutting the floating gate structures after the formation of the conformal dielectric layer, wherein the conformal dielectric layer is present on a surface of the semiconductor substrate between the adjacent floating gate conductors, a top surface of the floating gate structures and a sidewall of the floating gate structures, wherein the conformal dielectric layer is present between the at least one spacer and the floating gate structures.

7. The method of claim 1, wherein the sacrificial material comprises SiGe.

8. The method of claim 1, further comprising forming conductive spacers on the sidewall of the conformal dielectric material.

9. The method of claim 8, wherein said conductive spacer comprises doped polysilicon, TiN, WN, TaN or a combination thereof.

10. A method of forming a memory device comprising:
    forming at least two floating gate structures on a semiconductor substrate;
    forming a dielectric layer on the floating gate structures;
    forming a sacrificial material atop the dielectric layer that is present between adjacent floating gate conductors of the floating gate structures;
    forming a control gate conductor overlying each of the at least two floating gate structures, wherein the control gate conductor is separated from the each of the at least two floating gate structures by the dielectric layer;
    removing the sacrificial material to provide a void;
    filling the void with a low-k dielectric material that is present between the adjacent floating gate conductors of the at least two floating gate structures, wherein the low-k dielectric material is present along a first direction separating the adjacent floating gate conductors; and
    forming a source region and the drain region in the semiconducting substrate that are adjacent to each portion of the semiconducting substrate that is underlying the at least two floating gate structures, wherein the first direction separating the adjacent floating gate conductors is perpendicular to the length of the channel.

11. The method of claim 10, wherein the upper surface of the sacrificial material is substantially coplanar with an upper surface of the adjacent floating gate conductors.

12. The method of claim 10, wherein the low-k dielectric material comprises an oxide.

13. The method of claim 10, wherein the low-k dielectric material has a dielectric constant of less than about 3.5.

14. The method of claim 10, wherein the at least two floating gate structures include a floating gate atop a gate dielectric.

15. The method of claim 10 further comprising forming at least one isolation region in the semiconductor substrate between the adjacent floating gate conductors.

* * * * *